United States Patent [19]

Wilson

[11] Patent Number: 4,706,017

[45] Date of Patent: Nov. 10, 1987

[54] ELECTRICAL CURRENT SENSOR

[75] Inventor: Larry E. Wilson, Marion, Ind.

[73] Assignee: Hamilton Standard Controls, Inc., Farmington, Conn.

[21] Appl. No.: 762,475

[22] Filed: Aug. 5, 1985

[51] Int. Cl.⁴ .............................................. H01F 40/06
[52] U.S. Cl. .................................... 324/127; 336/175; 336/200; 336/216
[58] Field of Search ............... 336/200, 175, 216, 217; 324/127

[56] References Cited

U.S. PATENT DOCUMENTS 3,465,274  9/1969  Proctor ........................... 336/200 X
4,048,605  9/1977  McCollum ...................... 336/217 X Primary Examiner—Reinhard J. Eisenzopf
Assistant Examiner—Stephen M. Baker
Attorney, Agent, or Firm—Stephen A. Schneeberger

[57] ABSTRACT

A compact and inexpensive current sensor includes a planar coil assembly mounted, as by printing, on a substrate such as a circuit board. A closed-loop flux concentrator extends through the coil and also through the board. A conductor carrying the AC current to be sensed is positioned in proximity with the flux concentrator. The flux concentrator is of one-piece construction, having a pair of opposed leg portions in overlapping relation and fastened to the circuit board. A current-summing amplifier amplifies the low-amplitude emf provided by the coil assembly and, with further circuitry, provides an indication and/or control commensurate with the sensed current being above or below some value.

5 Claims, 7 Drawing Figures

U.S. Patent  Nov. 10, 1987  Sheet 1 of 2  4,706,017
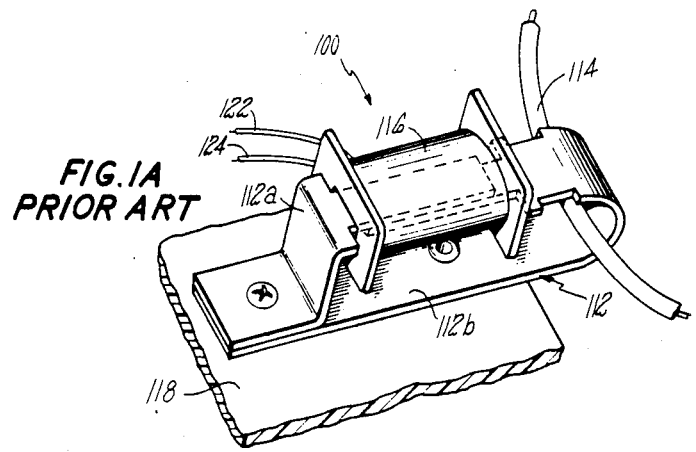
FIG. 1A PRIOR ART
FIG. 1B PRIOR ART
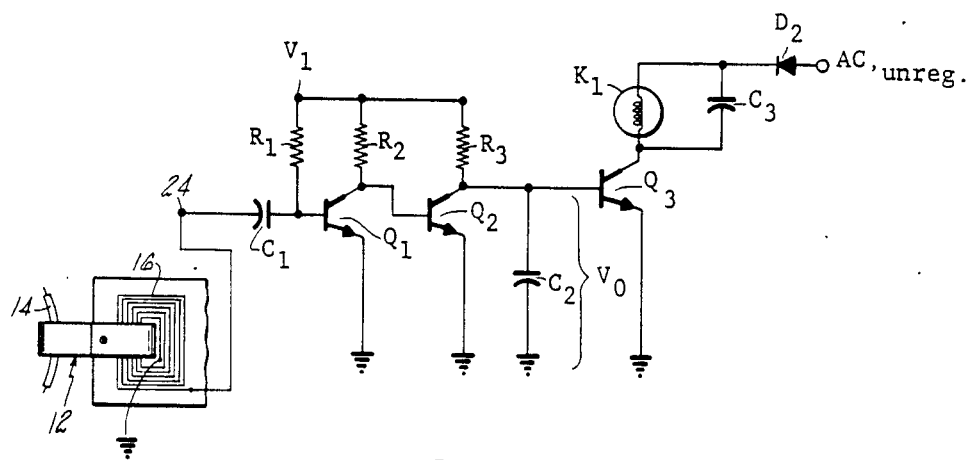
FIG. 6

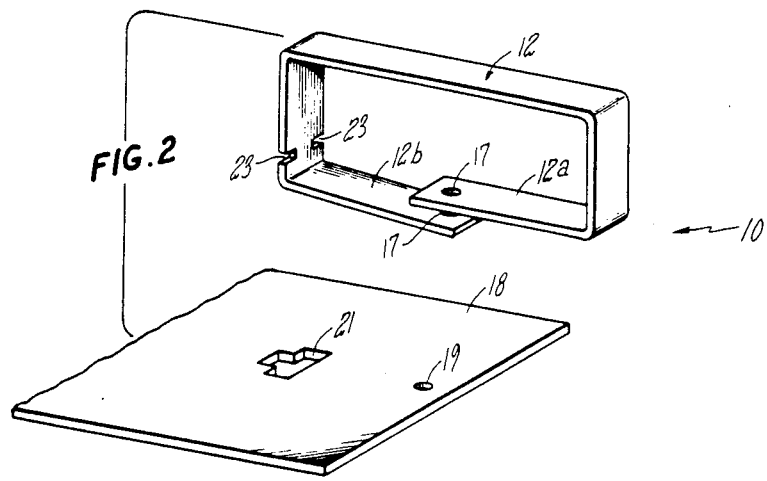
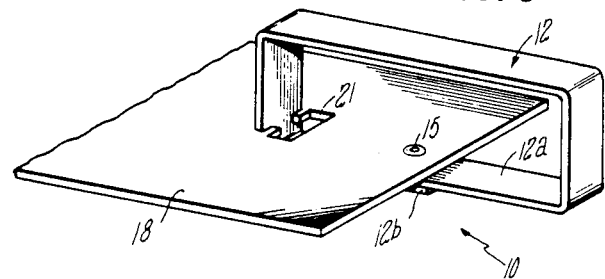
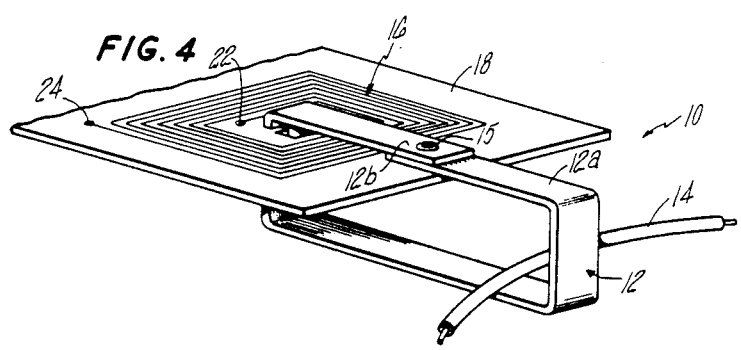
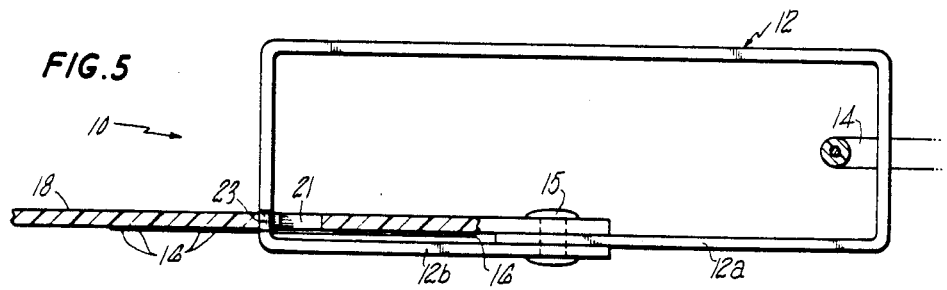

ELECTRICAL CURRENT SENSOR

TECHNICAL FIELD

The invention relates to current sensors and more particularly to current sensing controls for electrical alternating currents (AC). More particularly still, the invention relates to an improved current sensor of the type employing an annular coil assembly and a flux concentrator associated therewith.

BACKGROUND ART

Current sensors and current sensor controls are used for various purposes and take various forms. One common form of AC current sensing control utilizes a current transformer to develop a control voltage proportional to the electrical current passing through the sensed wire. Typically, the current transformer consists of a core or flux concentrator configured as a continuous band or closed loop, passing through a solenoidal coil. The magnetic field resulting from the current present in the wire or conductor to be sensed induces magnetic flux into the closed path of the flux concentrator. By transformer action, the ampere turns of the conductor are transformed into equivalent ampere turns in the linked solenoidal coil. The electromotive force (emf) so generated is conditioned and amplified as needed and may be used as a control voltage.

Current sensing controls are used for under and over current monitors as well as linear or proportional applications. In such monitoring applications, the resulting control voltage may only be required to provide an indication of the presence or absence of a critical current level. On the other hand, the control voltage provided by the current sensor may be used for various control functions which bear a linear, or at least proportional relation to the level of the sensed current. Current sensors are often employed in conjunction with electrical motors to provide an indication of the mechanical load on the motor by virtue of the sensed current level. One such example occurs with respect to motors used to drive compressors and/or fans in various refrigeration and heat pump systems.

A typical form of current sensor in accordance with the prior art has employed an annular solenoid coil in conjunction with a flux concentrator formed of two pieces. The solenoid coil is relatively bulky and expensive, particularly when used for those situations which require relatively low cost and/or compact design. Moreover, because of the relatively large number of turns in a conventional solenoidal coil, some variation in the actual number of turns from coil to coil typically exists, thereby giving rise to similar variations in the resulting signal. Similarly, such use of a solenoidal coil has typically required the utilization of a flux concentrator of two pieces to facilitate the mounting of the coil thereon.

Accordingly, it is an object of the present invention to provide an improved current sensor which is of relatively low cost to manufacture. Included within this object is a provision of such a current sensor which is relatively well suited for utilization in a system adapted to be mounted on a circuit board.

It is a further object of the present invention to provide an improved current sensor control which is capable of providing a reliable indication of the AC current within a conductor to be sensed.

SUMMARY OF INVENTION

In accordance with the invention there is provided, for sensing the current in a conductor normally intended to carry an alternating electrical current, an improved current sensor of the type including a substantially annular coil assembly having a pair of output terminals and having closed-loop flux concentrating means, the flux concentrating means being adapted to be positioned in juxtaposition with the current-carrying conductor and to extend as a core through the coil assembly whereby through transformer action, an emf representative of the current in the conductor appears at the output terminals of the coil assembly. The improved current sensor includes a coil assembly which is substantially planar in form and is mounted on a substrate. The flux concentrator extends through the substrate. Circuitry is connected to the output terminals of the planar coil assembly for at least amplifying the emf appearing thereat.

More specifically in accordance with a preferred embodiment, the planar coil assembly comprises a printed coil or wiring disposed on the surface of a circuit board. The accompanying circuitry of the current sensor may also be mounted on the circuit board. The flux concentrator is of one-piece construction, being generally rectangular in form and having a pair of oppositely-extending leg portions disposed in adjacent, overlapping relation. The flux concentrator is secured to the circuit board by fastening means, such as a rivet, extending through the overlapping leg portions of the flux concentrator and through the board.

The planar coil assembly typically has a relatively small number of turns, i.e. less than about 25, and provides an output emf of relatively small value. The accompanying amplifying circuitry is operative to increase the magnitude of the output signal to a suitable operating level, as for instance that necessary to control a relay. In one arrangement, that circuit includes a current-summing amplifier in which the ratio of first and second impedances connected to the base of a transistor determines the gain of the amplifier.

BRIEF DESCRIPTION OF THE DRAWINGS

FIG. 1A is a simplified perspective view of an AC current in accordance with the prior art;

FIG. 1B is a schematic circuit diagram in accordance with the prior art and illustrating the current sensor of FIG. 1A connected therein;

FIG. 2 is a perspective view of the current sensor of the invention, unassembled;

FIG. 3 is a perspective view of the current sensor of the invention following assembly;

FIG. 4 is a perspective bottom view of the current sensor of FIG. 3, showing the planar coil and the wire to be sensed;

FIG. 5 is a view of the current sensor of FIG. 4, partly in section and partly broken away; and FIG. 6 is a schematic diagram of the circuitry associated with the current sensor of the invention.

BEST MODE FOR CARRYING OUT THE INVENTION

Referring to FIG. 1A, there is llustrated a current sensor 100 in accordance with the prior art. The current sensor 100 includes a closed-loop flux concentrator 112 near which or through which a current-carrying conductor 114 extends in juxtaposition. A substantially annular solenoid coil 116 is mounted on an arm of the flux concentrator 112 which extends substantially coaxially therethrough. The flux concentrator 112 is formed of two component pieces, 112a and 112b, each having a narrowed leg portion which extends most of the way through the solenoid coil 116 in overlapping relation with one another. The two parts 112a and 112b of the flux concentrator 112 are joined to one another and are rigidly mounted to an appropriate substrate such as a printed circuit board 118.

As is well known, an electrical current flowing in conductor 114 creates a magnetic field around the conductor. Because of the proximity of that conductor 114 with the flux concentrator 112, a magnetic flux is induced in the closed, magnetically-conductive path of the concentrator 112. By transformer action, the ampere turns of the conductor 114 and concentrator 112 are transformed into equivalent ampere turns in the solenoid coil 116. The resulting electromotive force (emf) so generated in the solenoid 116 appears across the output terminals 122, 124 thereof. This output emf is then typically applied to appropriate amplifying circuitry, such as that illustrated in FIG. 1B, for use as a control voltage.

The current carried by conductor 114 is an alternating (AC) current such that the resulting output emf across solenoid terminals 122, 124 is also an AC signal voltage. Typically, a single turn of conductor 114 carrying an AC current of several amperes extends through a single-turn flux concentrator 112. The solenoid coil 116 may typically have hundreds, or even thousands, of turns such that the resulting output emf on terminal 122, 124 is in the range of one volt.

Referring to FIG. 1B, there is illustrated circuitry in accordance with the prior art for detecting the signal provided by solenoid coil 116 and for actuating a relay when the current exceeds (or conversely, is less than) a predetermined threshold. Specifically, one of the outputs of solenoid coil 116 is connected to ground and the other is connected through a diode $D_{10}$ to the base of a transistor $Q_{12}$ having its emitter connected to ground and its collector connected through a resistor $R_{13}$ to a supply potential of, for instance, 12 volts DC. The collector of transistor $Q_{12}$ is also connected to the base of a second transistor $Q_{13}$. A capacitor $C_{12}$ is connected between the collector of $Q_{12}$ and ground. The emitter of transistor $Q_{12}$ is grounded and the coil of a relay $K_{11}$ is connected between its collector and the supply potential. A snubbing diode $D_{15}$ is connected across the coil of relay $K_{11}$. The positive half cycles of the sinusoidal emf developed across solenoid 116 are extended through diode $D_{10}$ to effect conduction of transistor $Q_{12}$ which was normally in a nonconducting condition in the absence of such positive pulses. When transistor $Q_{12}$ is not conducting, capacitor $C_{12}$ charges to or toward the supply potential via resistor $R_{13}$. With such potential applied to the base of transistor $Q_{12}$, the transistor is normally in conduction and relay $K_{11}$ is actuated. However, when positive pulses are provided at a recurring frequency of 60 Hz to the base of transistor $Q_{12}$, the capacitor $C_{12}$ is relatively quickly discharged such that transistor $Q_{13}$ turns off and the relay $K_{11}$ drops out.

Referring to the current sensor of the invention as depicted in FIGS. 2-5, a substantially planar coil 16 is mounted on a substrate, such as printed circuit board 18, and a part of a flux concentrator 12 passes through the circuit board 18 substantially at the center of the coil 16. The coil 16 is "printed" on the surface of the substrate 18 in a suitable manner. As used herein, "printed" means the formation of a conductive coil pattern 16 either by the deposition of metal on substrate 18 or by etching. The coil 16 generally exists only in the plane of the surface of substrate 18 and for that reason is termed "planar". As used herein, it will be appreciated that the term "planar" is intended to apply not only to a coil 16 formed on a flat or linear surface, but also one which might be formed on a somewhat curved or curvilinear surface but which has no significant dimension axially of the coil.

The planar coil 16 is formed as a continuous series of substantially concentric and annular loops or turns, beginning with an inner loop of relatively small diameter and increasing continuously to an outermost loop of larger diameter. Output terminals 22 and 24 appear at the respective opposite ends of the conductive pattern which forms the planar coil 16.

The flux concentrator 12 is formed by bending a strip of ferromagnetic material into a generally rectangular form having a pair of oppositely-extending leg portions 12a and 12b extending relatively toward one another in overlapping relation. One of the side walls of the flux concentrator 12, for instance that adjacent to leg portion 12b, is provided with a pair of oppositely-disposed notches 23 extending into the opposite edges thereof. The planar coil 16 is disposed substantially concentrically about a slot 21 formed through the circuit board 18. The slot 21 is of a "T" shape, having a major width which is slightly greater than the normal width of concentrator 12 and a minor width which is only slightly greater than the width of concentrator 12 where the notches 23 exist. To assemble the flux concentrator 12 with the circuit board 18 and thus the coil 16, one of the free legs, i.e. 12b, of the concentrator is positioned near the slot 21 in board 18 and is then threaded, as by rotation of the concentrator, downwardly into the slot 21 until the notches 23 in the side wall of the concentrator are in substantially the same plane as the substrate 18. The concentrator 12 is then translated a short distance such that the notched portion of the concentrator is moved into the narrow portion of the slot 21 in board 18, as depicted most clearly in FIG. 3. In that location, both of the free legs 12a and 12b of concentrator 12 are disposed beneath the circuit board 18 in overlapping relation with one another.

A pair of openings 17 are formed through the concentrator 12 near the ends of the respective arms 12a and 12b so as to be in registry with one another. A similarly-sized opening 19 is formed through the circuit board 18 for alignment with the concentrator openings 17 when the concentrator 12 is in its mounted position as illustrated in FIGS. 3-5. A suitable fastener, such as rivet 15, may then extend through the concentrator openings 17 and the board opening 19 to rigidly mount the concentrator 12 to the board 18 and thus in fixed position with coil 16. The legs 12a and 12b of concentrator 12 are thus also joined such that concentrator 12 forms a continuous loop. With reference to FIG. 5, it will also be noted that the thickness of the material forming the concentrator 12 is greater than that of the material forming the respective turns or loops of the coil 16. In this way, the underlying concentrator leg 12a which is positioned laterally outboard of the coil assembly 16, serves as a spacer or a standoff for the overlapping concentrator leg 12b such that a clearance exists between it and the turns of the coil 16. The concentrator 12 is sized, either in height or preferably in length, to permit sufficient clearance between it and the circuit board through which a conductor 14 may be extended. The conductor 14 carries the alternating current, typically at 60 Hz, which is to be sensed by the sensor 10.

The above-described construction of the current sensor 10 of the invention is relatively compact in size and possibly more significantly, provides a coil assembly 16 which is of significantly less cost than the conventional solenoid coil 116 of FIG. 1A. In most applications, the planar coil assembly 16 will only be required to have relatively few turns, i.e. 5-25, with 8 turns being depicted in the illustrated embodiment. Because the coil 16 is comprised of only a few turns in a single plane pierced by the flux concentrator 12, the emf appearing across its output terminals 22, 24 is greatly reduced, but sufficient signal to noise ratio exists to make amplification practical. Typically, the current to be sensed in conductor 14 may be in the range of several amperes and the resulting emf between terminals 22, 24 is only several millivolts.

Referring to FIG. 6 there is schematically depicted the current sensor 10 and its associated amplification, detector, and control circuitry. One of the output terminals, i.e. 24, of the planar coil assembly 16 is connected to one side of capacitor $C_1$, the other side of that capacitor being connected to the base of transistor $Q_1$. A resistor $R_1$ is also connected from the base of transistor $Q_1$ to a DC supply voltage $V_1$ of 12 volts. The emitter of transistor Q1 is connected to ground and its collector is connected, through resistor $R_2$, to the supply voltage $V_1$. The collector of transistor $Q_1$ also is connected to the base of a grounded-emitter transistor $Q_2$. The collector of transistor $Q_2$ is connected through resistor $R_3$ to supply voltage $V_1$. A capacitor $C_2$ is connected between the collector of transistor $Q_2$ and ground. The output voltage $V_0$, developed across capacitor $C_2$ is generally representative of either the presence or the absence of a current exceeding some threshold level in the sensed conductor 14. More specifically, in the illustrated circuitry a value of $V_0$ which approaches the supply voltage $V_1$ is typically indicative of less current flow through conductor 14 than the threshold value, whereas the voltage $V_0$ will be low or nil when the current in conductor 14 exceeds the selected threshold value. The current threshold might typically be selected to be approximately one amp, such that a lesser value is interpreted as no current flow and a greater value is interpreted as normal current flow.

The collector of transistor $Q_2$ is connected to the base of a transistor $Q_3$ which has its emitter connected to ground. The coil of a relay $K_1$ is connected at one end to the collector of transistor $Q_3$ and at its other end, through diode $D_2$, to a source of unregulated AC supply voltage of approximately 24 volts rms.

Referring to the operation of the circuitry of FIG. 6, the functions of transistors $Q_2$ and $Q_3$, capacitor $C_2$ and resistor $R_3$ are analogous to those of transistors $Q_{12}$ and $Q_{13}$, capacitor $C_{12}$ and resistor $R_{13}$ in the prior art circuit of FIG. 1B. However, the circuitry including coil 16, capacitor $C_1$, resistors $R_1$ and $R_2$ and transistor $Q_1$ provides a current summing amplifier which is responsive to the presence or absence of an AC signal of small amplitude appearing across coil 16 for effecting the requisite control of the circuitry including transistors $Q_2$ and $Q_3$ and capacitor $C_2$. Transistor $Q_1$ is biased "ON" by base resistor $R_1$. The sensor coil 16 is AC coupled to the base of transistor $Q_1$ through capacitor $C_1$. Normally transistor $Q_1$ is saturated and transistor $Q_2$ is "OFF", allowing capacitor $C_2$ to charge toward the supply voltage $V_1$ as described with respect to the circuit of FIG. 1B. Although the positive half cycles of the emf developed across coil 16 only reinforce this condition, the negative half cycles of that voltage act to first sink enough base current from transistor $Q_1$ to take $Q_1$ out of saturation and then to allow the voltage on the collector of that transistor to rise such that transistor $Q_2$ is turned "ON".

As was discussed with reference to FIG. 1A, conduction through transistor $Q_2$ serves to rapidly discharge capacitor $C_2$ such that the output voltage $V_0$ is driven to, or near, zero. Although capacitor $C_2$ begins to charge toward the supply voltage $V_1$ during the positive half cycles of coil 16, the time constant of resistor $R_3$ and capacitor $C_2$ is long compared to the repetition rate of the sensed voltage and the output voltage $V_0$ "ratchets" downward to zero in a very few cycles.

The gain of the current summing amplifier is determined principally by the ratio of the impedances in the two current paths connected to the base of transistor $Q_1$, and thus may be easily regulated by circuit design without relying upon a specific gain of the transistor $Q_1$ itself. The base current for transistor $Q_1$ is determined principally by the ratio of impedances in the two circuit branches which include firstly, $R_1$, and secondly, $Z_{16}$ and $Z_{C1}$. In a representative embodiment, resistor $R_1$ may have a value of about 1.5 megohm, the impedance of coil 16 is only milliohms and the impedance of capacitor $C_1$ at 60 Hz is approximately 120 ohms, such that the impedances of capacitor $C_1$ and resistance $R_1$ determine the ratio. In the illustrated instance, the gain of the circuit is approximately 10,000, such that the millivolt emf provided by coil 16 may be amplified sufficiently to control the transistor switch $Q_2$.

It will be noted also that the supply voltage for relay $K_1$ may be provided from an unregulated AC source without need to rely upon conventional rectification and filtering because of a voltage management technique which is provided by connecting capacitor $C_3$ across the coil of relay $K_1$. The unregulated AC voltage applied to the anode of diode of $D_2$ might typically provide peak voltages ranging from 22 to 44 volts. The minimum pull-in voltage of relay $K_1$ is specified as 15.2 volts, whereas the maximum voltage allowable of the coil of the relay is 39 volts with derating to 31 volts at high temperature extremes. Thus, instead of regulating the relay supply and using costly dropping resistors, capacitor $C_3$ is placed across the coil of relay $K_1$. Capacitor $C_1$ acts as a necessary load support, supplying relay current during the supply voltage negative half cycle to prevent buzz or chatter. Further, by choosing the value of capacitor $C_1$ correctly and controlling the ripple voltage, the rms voltage across the relay coil will be lower than the maximum allowed, but above the drop-out voltage for the limit relay. Further still, the inclusion of capacitor $C_3$ connected across the coil of relay $K_1$ absorbs, or actually prevents, the turn-off transient, thus obviating the need for a clamp diode and saving the price of one component.

Although this invention has been shown and described with respect to detailed embodiments thereof, it will be understood by those skilled in the art that various changes in form and detail thereof may be made without departing from the spirit and scope of theaimed invention.

Having thus described a typical embodiment of the invention, that which is claimed as new and desired to secure by Letters Patent of the U.S. is:

1. For sensing the current in a conductor intended to carry an laternating electrical current, an improved current sensor of the type including a substantially annular coil assembly having a pair of output terminals and having closed-loop flux concentrating means extending through the coil, the flux concentrating means being adapted to be in justaposition with the current-carrying conductor, and wherein an emf representative of the current in the conductor appears at the output terminals of the coil assembly, the improvement wherein:

said coil assembly is substantially planar and is printed on the surface of a circuit board;

said flux concentrator is of one-piece construction and extends through said planar coil assembly and said circuit board, said flux concentrator including a pair of oppositely-extending leg portions disposed in adjacent overlapping relation, said flux concentrator being secured to said circuit board by fastening means acting between said overlapping leg portions of said flux concentrator and said circuit board; and including circuit means connected to the output terminals of said planar coil assembly for at least amplifying the emf appearing thereat.

2. The current sensor of claim 1 wherein at least part of said circuit means is also mounted on said circuit board.

3. The current sensor of claim 1 wherein said circuit board and said flux concentrator include complementary geometries which cooperate to bidirectionally prevent movement of said concentrator normal to the surface of said circuit board on which said planar coil assembly is mounted.

4. The current sensor of claim 1 wherein said planar coil assembly comprises a relatively small number of turns less than about 25.

5. The current sensor of claim 1 wherein said circuit means includes a current-summing amplifier, said amplifier including semiconducting means having a control electrode and current-summing means operatively connected to said control electrode, said current-summing means including first and second impedances, the gain of said amplifier being determined subtantially by the ratio of said first and second impedances.

* * * * *